United States Patent [19]

Wanat

[11] Patent Number: 5,200,291
[45] Date of Patent: Apr. 6, 1993

[54] PHOTOSENSITIVE DIAZONIUM RESIN, ELEMENT MADE THEREFROM, METHOD OF PREPARING THE RESIN AND METHOD FOR PRODUCING NEGATIVE LITHOGRAPHIC IMAGE UTILIZING THE RESIN

[75] Inventor: Stanley F. Wanat, Scotch Plains, N.J.

[73] Assignee: Hoechst Celanese Corporation, Somerville, N.J.

[21] Appl. No.: 684,547

[22] Filed: Apr. 11, 1991

Related U.S. Application Data

[63] Continuation-in-part of Ser. No. 434,374, Nov. 13, 1989, abandoned.

[51] Int. Cl.$^5$ .......................... G03F 7/021; G03F 7/32
[52] U.S. Cl. ..................................... 430/163; 430/157;
430/168; 430/175; 430/272; 430/278; 430/302;
430/325; 430/330; 430/331; 525/61; 525/330.3;
525/330.5; 525/376; 534/560; 534/561;
534/563; 534/564; 534/565
[58] Field of Search ............... 430/175, 325, 330, 331,
430/168, 169, 163, 176, 157, 302; 525/61, 330.3,
330.5, 376; 534/558, 559, 560, 561, 562, 563,
564, 565

[56] References Cited

U.S. PATENT DOCUMENTS

| 2,498,722 | 2/1950 | Straley | 430/163 |
|---|---|---|---|
| 3,219,447 | 11/1965 | Neugebauer et al. | 430/163 |
| 3,304,297 | 2/1967 | Wegmann . | |
| 3,679,419 | 7/1972 | Gillich | 430/157 |
| 3,720,563 | 3/1973 | Kalopssis . | |
| 3,847,614 | 11/1974 | Mattor | 430/163 |
| 3,849,392 | 11/1974 | Steppan | 430/157 |
| 3,867,147 | 2/1975 | Teuscher | 430/163 |
| 4,436,804 | 3/1984 | Walls | 430/157 |
| 4,554,236 | 11/1985 | Bentley et al. | 430/175 |
| 4,564,580 | 1/1986 | Ichimura et al. | 430/175 |
| 4,618,562 | 10/1986 | Walls et al. | 430/157 |
| 4,707,437 | 11/1987 | Walls et al. | 430/175 |
| 4,812,384 | 3/1989 | Franke et al. | 430/175 |
| 4,940,646 | 7/1990 | Pawlowski | 430/175 |

FOREIGN PATENT DOCUMENTS 2030575 4/1980 United Kingdom .
2076826 12/1981 United Kingdom .

Primary Examiner—Charles L. Bowers, Jr.
Assistant Examiner—Christopher G. Young
Attorney, Agent, or Firm—Richard S. Roberts

[57] ABSTRACT

A polymeric compound having the formula

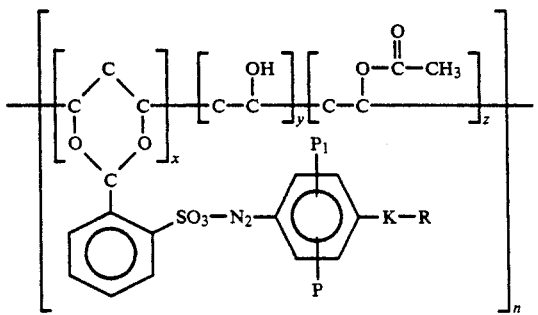

wherein
x ranges from about 0.05 to about 0.5
y ranges from about 0.80 to about 0.35
z ranges from about 0.10 to about 0.25
n ranges from about 50 to about 1500
R is selected from the group consisting of phenyl and $C_1$ to $C_4$ alkyl substituted phenyl;
K is selected from the group consisting of $$-\overset{H}{\underset{|}{N}}-,$$

—S—, —O—, and —$CH_2$—, or is absent;
P and $P_1$ are selected from the group consisting of $C_1$ to $C_4$ alkyl, methoxy, ethoxy, butoxy, and H; and
$P_1$ may be the same as P or different.

20 Claims, No Drawings

PHOTOSENSITIVE DIAZONIUM RESIN, ELEMENT MADE THEREFROM, METHOD OF PREPARING THE RESIN AND METHOD FOR PRODUCING NEGATIVE LITHOGRAPHIC IMAGE UTILIZING THE RESIN

CROSS-REFERENCE TO RELATED APPLICATION

This application is a continuation-in-part of U.S. Pat. application Ser. No. 07/434,374, filed Nov. 13, 1989, now abandoned, which is incorporated herein by reference.

BACKGROUND OF THE INVENTION

This invention relates to novel light-sensitive condensation products of aromatic diazonium salts, processes for preparation thereof, and to light-sensitive reproduction materials, which comprise a support having a reproduction layer thereon containing at least one of the novel light-sensitive products.

It is known to use light-sensitive aromatic diazonium compounds for sensitizing reproduction materials which are useful for the production of single copies, printing plates, screen printing, color proofing foils and other applications in the reproduction arts.

U.S. Pat. Nos. 3,867,147; 3,679,419 and 3,849,392 relating to mixed diazo condensates, the contents of which are hereby incorporated by reference, describe an advance overcoming disadvantages of prior art diazo compounds and reproductive layers made therefrom.

Diazonium compounds conventionally known as light-sensitive agents for making light-sensitive lithographic printing plates can be divided into two kinds depending on their specific properties. That is, one kind is a diazonium compound capable of being decomposed by exposure into an oleophilic material and the other kind is a diazo compound capable of being converted by exposure into an alkali-soluble substance. When a composition containing the former kind of compound is applied on a hydrophilic support and the support is exposed to light through a transparent or translucent negative original, only the exposed portions are rendered hydrophobic and organophilic, that is, water repellent and ink receptive, and the unexposed portions can easily be removed with water or a phosphate solution whereby a negative image can be obtained. Such a system is described in detail in U.S. Pat. No. 2,714,066. On the other hand, when a composition containing the latter kind of compound is dissolved in an organic solvent, applied to a hydrophilic support and after exposure is developed by an alkaline solution, the exposed portions are dissolved out to provide a positive image. Such a system is described in detail in U.S. Pat. Nos. 3,046,122 and 3,046,123.

The compounds described in the above-mentioned U.S. patent specifications are low-molecular weight compounds and hence if such a compound is used individually it is deposited in crystalline form which results in lowering the mechanical strength of the image obtained and making long press runs difficult to attain. Accordingly, a resin such as a phenolformaldehyde resin, shellac or styrene-maleic anhydride resin is used as a carrier for the compound to prevent the light-sensitive layer from crystallizing and to compensate for any weakening of the mechanical strength. However, if materials other than a light-sensitive agent are incorporated into the light-sensitive layer there is a tendency to reduce the sharpness of the light-sensitive layer to development. In order to overcome such a difficulty, it is disclosed in U.S. pat. No. 3,046,120 that the light-sensitive agent itself is converted into a high molecular weight compound. However, if an aluminum plate is used as a support, the adhesive property of the compound described in the specification of the above U.S. patent with the aluminum is low, which results in reducing the mechanical strength of the image, and hence the practical value of such a plate is low.

Therefore, an object of the present invention is to provide a light-sensitive lithographic printing plate containing an improved light-sensitive agent unaccompanied by the abovementioned drawbacks. Other objects of this invention are to form a coating having sufficient film strength without the necessity of adding other film-forming agents as well as to increase the adhesive property between an aluminum plate and the coating thereon. A further object is to provide a sensitizer capable of being converted to a high molecular state and at the same time having a good film-forming capability.

The thereby produced photosensitive resin effectively serves as both the photosensitive component and the binder resin simultaneously without requiring the use of additional binding resins.

SUMMARY OF THE INVENTION

The invention provides a polymeric compound having the formula

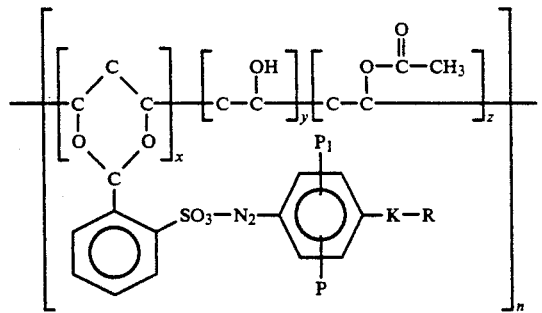

wherein
x ranges from about 0.05 to about 0.5
y ranges from about 0.80 to about 0.35
z ranges from about 0.10 to about 0.25
n ranges from about 50 to about 1500
R is selected from the group consisting of phenyl and $C_1$ to $C_4$ alkyl substituted phenyl;
K is selected from the group consisting of

—S—, —O—, and —CH$_2$—, or is absent;
P and $P_1$ are selected from the group consisting of $C_1$ to $C_4$ alkyl, methoxy, ethoxy, butoxy, and H; and $P_1$ may be the same as P or different.

The invention also provides a photographic element which comprises a substrate, and a photosensitive composition coated on said substrate, wherein said composition comprises the above compound.

The invention still further provides a method for preparing a polymeric compound having the formula

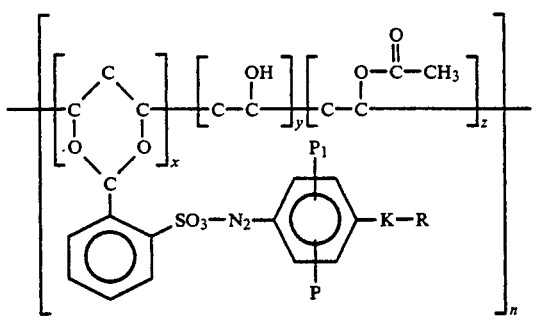

wherein
x ranges from about 0.05 to about 0.5
y ranges from about 0.80 to about 0.35
z ranges from about 0.10 to about 0.25
n ranges from about 50 to about 1500
R is selected from the group consisting of phenyl and $C_1$ to $C_4$ alkyl substituted phenyl;
K is selected from the group consisting of

—S—, —O—, and —CH$_2$—, or is absent;
P and P$_1$ are selected from the group consisting of $C_1$ to $C_4$ alkyl, methoxy, ethoxy, butoxy, and H; and P$_1$ may be the same as P or different;
which method comprises providing a poly(vinyl alcohol/vinyl acetate) copolymer having a molecular weight of from about 5,000 to about 100,000 and from about 75% to about 90% hydrolysis by weight, and reacting said copolymer with a sufficient amount of an aromatic aldehyde salt in the presence of an acid to provide an aromatic ketal acid condensate of the reactants; then treating said ketal condensate with a sufficient amount of a base to produce a ketal condensate salt; and then reacting said ketal condensate salt with a sufficient amount of light-sensitive diazonium salt monomer to effect an ion exchange between said salts whereby a diazonium compound radical is substituted onto the aromatic ring of said ketal condensate.

DETAILED DESCRIPTION OF THE PREFERRED EMBODIMENT

In the production of the light-sensitive resins of this invention, one begins with a poly(vinyl alcohol/vinyl acetate) copolymer. The polyvinyl alcohol/polyvinyl acetate copolymers useful as a starting material for the production of the binder resin useful in this invention are those having from about 75% to about 90% hydrolysis by weight and, preferably, an average molecular weight (AMW) of from about 5,000 to about 100,000. As used in this application hydrolysis is on a weight basis and not a mole basis. Such polymers may have the formula:

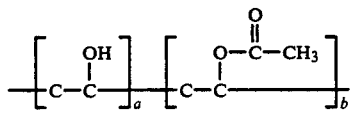

wherein
a ranges from about 0.75 to about 0.90 b ranges from about 0.10 to about 0.25
Such copolymers are easily synthesized by methods known to those skilled in the art, or are commercially available. Suitable copolymers include Vinol 523 (AMW~70,000) and Vinol 205 (AMW~26,000) available from Air Products Co. of Allentown, Pa.; Elvanol 52-22 (AMW~72,000) available from DuPont of Wilmington, Del.; Gelvatol 20-30 (AMW~10,000), Gelvatol 20-60 (AMW~10,000) and Gelvatol 20-90 (AMW~90,000) available from Monsanto Co. of St. Louis, Mo. Preferably, the copolymer has an average molecular weight in the range of about 10,000 to about 95,000.

The process steps for preparing the foregoing resin include first dissolving a polyvinyl alcohol/polyvinyl acetate copolymer in a mixture of water and an aqueous acid to form a reaction solution. Added to the acidified mixture is an aromatic aldehyde salt to thereby produce a cyclic ketal condensate. This is then rebasified with an alkali to quench the reaction mixture and form a cyclic ketal condensate salt. This is then reacted with a diazonium salt to effect an ion exchange whereby the resin acquires the light-sensitive diazo function.

Condensations are normally conducted in strong acid media. Suitable acids include $H_3PO_4$, $H_2SO_4$, HCl, HBr, $HPF_6$, $H_3PO_3$, $HBF_4$ at concentrations of 70-100%. Preferred acids are $H_3PO_4$ and $H_2SO_4$. For $H_2SO_4$, 96% w/w is a preferred concentration when this acid is used.

Preferred aromatic aldehydes non-exclusively include the ortho sulfonic acid of benzaldehyde, the para-sulfonic acid of benzaldehyde and mixed o- and p-sulfonic acids of benzaldehyde.

In the preferred embodiment, approximately equimolar amounts of poly(vinyl alcohol/acetate) and aldehyde are used, that is, one aldehyde group per repeating monomer group of the copolymer although such equimolar amounts are not required. For example, in certain circumstances it may be desired to provide an alternating polymer wherein the aldehyde reacts in a spaced fashion along the copolymer chain. The thusly produced intermediate is found to have the salt of the aromatic aldehyde replaced by a pendant sulfonic acid group. One returns to the salt by reaction with a suitable base such as an alkali metal hydroxide. This latter component is then condensed with a diazonium salt by ion exchange at the salt site. Non-exclusive examples of suitable diazonium salts may be represented by the formula

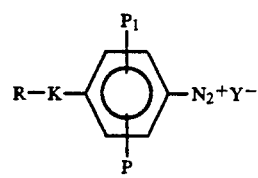

wherein
R is selected from the group consisting of phenyl and $C_1$ to $C_4$ alkyl substituted phenyl.
—K— is selected from the group consisting of

—S—,—O—, and —CH$_2$—, or is absent;

P and $P_1$ are selected from the group consisting of $C_1$ to $C_4$ alkyl, methoxy, ethoxy, butoxy, and H;
$P_1$ may be the same as P or different; and
$y^-$ is an anion.

Where $R_1$ is a substituted phenyl in the above formula, the substituent group is preferably located in the para position and its preferred substituent group is methyl, i.e., p-tolyl. Preferred anions are selected from the group consisting of $SO_4^-$, $SO_3^-$, $PO_4$, $Cl^-$, $Br^-$, $F^-$, and $NO_3^-$.

Individual suitable diazo monomers include but are not restricted to the following:
Diphenylamine-4-diazonium chloride,
Diphenylamine-4-diazonium bromide,
Diphenylamine-4-diazonium sulfate,
3-methoxy-diphenylamine-4-diazonium sulfate,
3-methoxy-diphenylamine-4-diazonium chloride
3-methoxy-diphenylamine-4-diazonium bromide,
3-ethoxy-diphenylamine-4-diazonium chloride,
3-ethoxy-diphenylamine-4-diazonium bromide,
3-ethoxy-diphenylamine-4-diazonium sulfate,
2-methoxy-diphenylamine-4-diazonium chloride,
2-methoxy-diphenylamine-4-diazonium sulfate,
4-methoxy-diphenylamine-4-diazonium sulfate,
4-methoxy-diphenylamine-4-diazonium chloride,
4-methyl-diphenylamine-4-diazonium chloride,
4-methyl-diphenylamine-4-diazonium sulfate,
3-methyl-diphenylamine-4-diazonium chloride,
3-methyl-diphenylamine-4-diazonium sulfate,
3-ethyl-diphenylamine-4-diazonium chloride,
3,3'-bis-methyl-diphenylamine-4-diazonium chloride,
3-methyl-6-methoxy-diphenylamine-4-diazonium chloride,
2-methyl-5-chloro-diphenylamine-4-diazonium sulfate,
3-chloro-diphenylamine-4-diazonium sulfate,
Diphenylamine-4-diazonium chloride-2-carboxylic acid,
3-isopropyloxy-diphenylamine-4-diazonium chloride,
4-n-butyloxy-diphenylamine-4-diazonium chloride,
2,5-diethoxy-diphenylamine-4-diazonium chloride,
4-methoxy-2-ethoxy-diphenylamine-4-diazonium chloride,
3-isoamyloxy-diphenylamine-4-diazonium chloride,
3,4-dimethoxy-diphenylamine-4-diazonium chloride,
2-n-propyloxy-diphenylamine-4-diazonium chloride,
2-n-butyloxy-diphenylamine-4-diazonium chloride,
4-(4-methoxy-phenylmercapto)-2,5-diethoxybenzenediazonium chloride Additional suitable diazo monomers include:
4-diazo-2,5-diethoxy-1-(4-tolymercapto)benzene chloride,
4-diazo-2,5-diethoxy-1-(4-tolymercapto)benzene sulfate,
4-diazo-2,5-diethoxy-1-(4-tolymercapto)benzine bromide,
p-diazo-N-ethyl-N-benzylaniline chloride,
p-diazo-N-ethyl-N-benzylaniline sulfate,
p-diazo-N-ethyl-N-benzylaniline bromide.

It is to be understood that the anions show with their specifications above, may in most cases be interchanged and selected from the anions given with the general formula for diazo monomers shown supra.

In conducting the condensation reaction diazo monomers are used such as phosphates, chlorides, bromides, sulfates, nitrates, or fluorides.

As an exemplary reaction scheme, one photosensitive resin may be prepared by the following procedure. Analogous but different starting materials would produce analogous results and the specific reaction details would be clear to those skilled in the art.

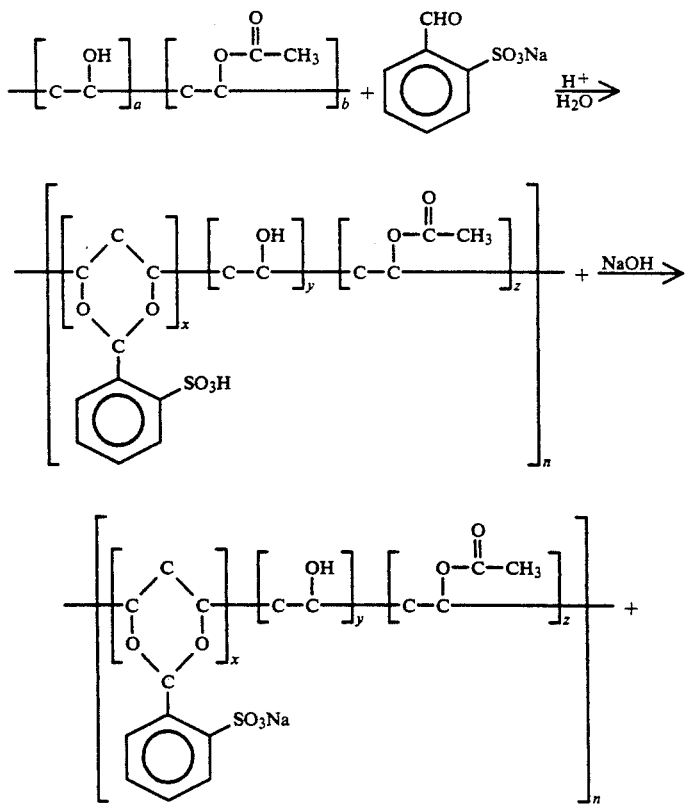

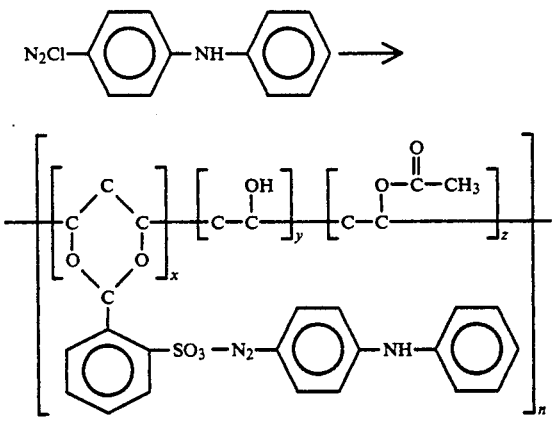

wherein
- a ranges from about 0.75 to about 0.90
- b ranges from about 0.10 to about 0.25
- x ranges from about 0.05 to about 0.5
- y ranges from about 0.80 to about 0.35
- z ranges from about 0.10 to about 0.25
- n ranges from about 50 to about 1500.

The light sensitive diazonium polymer prepared according to the invention may be used in reproduction layers in the conventional way. They may be dissolved in water or solvents and coated on supports to form printing plates, color proofing foils, resists for printed circuitry and the like.

The diazonium containing resin is preferably present in a coating composition of the subject invention at a percent solids level of from about 1% to about 20% by weight and most preferably the diazonium salt is present at a percent solids level of from about 1% to about 5%

Other components which may be optionally included in the coating composition of this invention include acid stabilizers, binders, exposure indicators, plasticizers, photoactivators, wetting agents and colorants.

Such are described in U.S. Pat. No. 3,679,419 which is incorporated by reference.

Suitable acid stabilizers useful within the context of this invention include phosphoric, citric, benzoic, m-nitro benzoic, p(p-anilino phenylazo)benzene sulfonic acid, 4,4'-dinitro-2,2,-stilbene disulfonic, itaconic, tartaric and p-toluene sulfonic acid and mixtures thereof. Preferably, the acid stabilizer is phosphoric acid. When used, the acid stabilizer is present in the radiation-polymerizable composition it is preferably present in the amount of from about 0.02% to about 2.0% by weight of the composition, and most preferably from about 0.05% to about 1.0%, although the skilled artisan may use more or less as desired. Exposure indicators (or photoimagers) which may be useful in conjunction with the present invention include 4-phenylazodiphenylamine, eosin, azobenzene, Calcozine Fuchsine dyes and Crystal Violet and Methylene Blue dyes. Preferably, the exposure indicator is 4-phenylazodiphenylamine. The exposure indicator, when one is used, is preferably present in the composition in an amount of from about 0.01% to about 0.35% by weight. A more preferred range is from about 0.02% to about 0.30% and, most preferably, the exposure indicator is present in an amount of from about 0.02% to about 0.20%, although the skilled artisan may use more or less as desired.

Colorants useful herein include dyes such as Rhodamine, Calcozine, Victoria Blue and methyl violet, and such pigments as the anthraquinone and phthalocyanine types. Generally, the colorant is present in the form of a pigment dispersion which may comprise a mixture of one or more pigments and/or one or more dyes dispersed in a suitable solvent or mixture of solvents. When a colorant is used, it is preferably present in the composition of this invention in an amount of from about 2.0% to about 35.0% by weight, more preferably from about 5.0% to about 30.0% and most preferably from about 5.0% to about 2.0% although the skilled artisan may use more or less as desired.

In order to form a coating composition for the production of photographic elements, the composition of this invention may be dissolved in admixture in a solvent or mixture of solvents to facilitate application of the composition to the substrate. Suitable solvents for this purpose include water, tetrahydrofuran, butyrolactone, glycol ethers such as propylene glycol monomethyl ether and methyl Cellosolve, alcohols such as ethanol and n-propanol, and ketones such as methyl ethyl ketone, or mixtures thereof. Preferably, the solvent comprises a mixture of tetrahydrofuran, propylene glycol monomethyl ether and butyrolactone. In general, the solvent system is evaporated from the coating composition once it is applied to an appropriate substrate, however, some insignificant amount of solvent may remain as residue.

Substrates useful for coating with the composition of this invention to form a photographic element such as a color proofing film, photoresist or lithographic printing plate include sheets of transparent films such as polyester, aluminum and its alloys and other metals, silicon and similar materials which are well known in the art. Preferably, the substrate comprises aluminum. The substrate may first be pretreated by standard graining and/or etching and/or anodizing techniques as are well known in the art, and also may or may not have been treated with a composition such as polyvinyl phosphonic acid, sodium silicate or the like suitable for use as a hydrophilizing agent.

In the production of photographic elements such as lithographic printing plates, an aluminum substrate is first preferably grained by art recognized methods such as by means of a wire brush, a slurry of particulates or by chemical or electrochemical means, for example in an electrolytic solution comprising hydrochloric acid. The grained plate is preferably then anodized for example in sulfuric or phosphoric acid in a manner well known in the art. The grained and optionally anodized surface is preferably then rendered hydrophilic by treatment with polyvinyl phosphonic acid by means which are also known to the skilled artisan. The thusly prepared plate is then coated with the composition of the present invention preferably at a coating weight of from about 0.5g/m² to about 2.5 g/m², more preferably from about 0.8 g/m² to about 2.0 g/m² and most preferably about 1.0 g/m² to form a photographic element such as a color proofing film, photoresist or lithographic printing plate includes sheets of transparent film such as polyester, aluminum and its alloys and other metals, silicon and similar materials which are well known in the art. Preferably, the substrate comprises aluminum. The substrate may first be pretreated by standard graining and/or etching and/or anodizing techniques as are well known in the art, and also may or may not have been treated with a composition such as polyvinyl phosphonic acid, sodium silicate or the like suitable for use as a hydrophilizing agent.

Preferably the thus prepared photographic element is exposed to actinic radiation through a negative test flat so as to yield a solid 6 on a 21 step Stouffer exposure wedge after development. The exposed plate is then developed with a suitable organic solvent free aqueous developer composition such as a developer which comprises an aqueous solution containing one or more of the following groups:

(a) a sodium. potassium or lithium salt of octyl, decyl or dodecyl monosulfate;
(b) a sodium, lithium, potassium or ammonium metasilicate salt; and
c) a lithium, potassium, sodium or ammonium borate salt; and
d) an aliphatic dicarboxylic acid, or sodium, potassium or ammonium salt thereof having from 2 to 6 carton atoms; and
e) mono-, di-, or tri-sodium or -potassium phosphate.

Other suitable developers include water, benzoic acid or sodium, lithium and potassium benzoates and the hydroxy substituted analogs thereof as well as those developers described in U.S. Pat. No. 4,436,807.

In conventional use, the developed plate is finished with a subtractive finisher such as a hydrophilic polymer. Examples include cold water soluble dextrin and/or polyvinyl pyrrolidone, a nonionic surfactant, a humectant, an inorganic salt and water, as taught by U.S. Pat. No. 4,213,887.

For the purpose of improving the press performance of a plate prepared as described above, it is known that baking of the exposed and developed plate can result in an increase in the number of quality impressions over that otherwise obtainable. To properly bake the plate, it is first treated with a solution designed to prevent loss of hydrophilicity of the background during baking. An example of an effective solution is disclosed in U.S. Pat. No. 4,355,096, the disclosure of which is hereby incorporated herein by reference. The thusly prepared plate is then heat treated by baking at temperature of from about 180° C. up to the annealing temperature of the substrate, most preferably about 240° C. The effective baking time is inversely proportional to the temperature and averages in the range of from about 2 to about 15 minutes. At 240° C., the time is about 7 minutes. The following examples are illustrative of the invention but it is understood that the invention is not limited thereto. None o the plates prepared in the examples have an oxygen barrier layer thereon nor were they processed in a nitrogen barrier environment.

EXAMPLE 1

14.8 g (0.2 mol) of Gelvatol 20/30 and 10.4g (0.05mol) of orthobenzaldehyde sodium sulfonate are dissolved in approximately 250 ml of water while heating. Five ml of concentrated sulfuric acid are added to the reaction mixture and it is heated to 90°-95° C. for four hours. The reaction mixture is cooled to room temperature. Gummy white solids are precipitated with acetone (salted out of aqueous phase with sodium chloride). The solids are redissolved in water and neutralized with sodium hydroxide (slightly basic ~7.2 pH). White solids precipitate out with acetone. A 10% nominal solution of this reaction product is prepared. A 10% solution of para-diazo diphenylamine chloride salt in water is also prepared. The two solutions are added while stirring and a tan solid is obtained. Excess water is poured off and the reaction product dissolved to make a 2-3% solids solution. A hazy solution is noticed. The solution is coated and dried on a sheet of unetched, anodized aluminum using a whirler coater to thereby produce a lithographic printing plate. The plate is exposed for 20 BAU and developed with water. Development is completed in about one minute with mild rubbing to produce an image which is ink receptive.

COMPARATIVE EXAMPLE 1

The foregoing example is repeated except the pure, unreacted, para-diazo diphenylamine solution is coated onto the aluminum sheet. When development is attempted after exposure, the entire coating is removed, including both exposed and unexposed areas. An effective lithographic printing plate cannot be produced.

COMPARATIVE EXAMPLE 2

The foregoing example is repeated except the pure, unreacted, para-diazo diphenylamine solution in admixture with Gelvatol 20/30 is coated onto the aluminum sheet. When development is attempted after exposure, the entire coating is removed, including both exposed and unexposed areas. An effective lithographic printing plate cannot be produced.

What is claimed is:
1. A polymeric compound having the formula

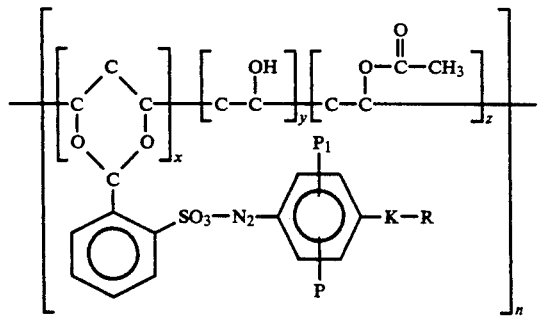

wherein
x ranges from about 0.05 to about 0.5
y ranges from about 0.80 to about 0.35
z ranges from about 0.10 to about 0.25
n ranges from about 50 to about 1500
R is selected from the group consisting of phenyl and C₁ to C₄ alkyl substituted phenyl;

K is selected from the group consisting of $$-\overset{H}{\underset{|}{N}}-,$$

—S—, —O—, and —CH$_2$—, or is absent;
P and P$_1$ are selected from the group consisting of C$_1$ to C$_4$ alkyl, methoxy, ethoxy, butoxy, and H; and P$_1$ may be the same as P or different.

2. The compound of claim 1 wherein K is NH, R is phenyl and P and P$_1$ are H.

3. A photographic element which comprises a substrate, and a photosensitive composition coated on said substrate, wherein said composition comprises the compound of claim 1.

4. The element of claim 3 wherein said composition further comprises one or more additional components selected from the group consisting of solvents, acid stabilizers, exposure indicators, binding resins, plasticizers, photoactivators and colorants.

5. The element of claim 3 wherein said substrate comprises one or more components selected from the group consisting of transparent films, polymeric materials, metals, silicon and semiconductor materials.

6. The element of claim 3 wherein said substrate comprises polyethylene terephthalate.

7. The element of claim 3 wherein said substrate comprises aluminum.

8. The element of claim 7 wherein said aluminum substrate has had its surface treated with one or more processes selected from the group consisting of anodizing, graining and hydrophilizing.

9. The element of claim 3 wherein K is NH, R is phenyl and P and P$_1$ are H.

10. A method for preparing a polymeric compound having the formula

[structural formula]

wherein
x ranges from about 0.05 to about 0.5
y ranges from about 0.80 to about 0.35
z ranges from about 0.10 to about 0.25
n ranges from about 50 to about 1500
R is selected from the group consisting of phenyl and C$_1$ to C$_4$ alkyl substituted phenyl;
K is selected from the group consisting of $$-\overset{H}{\underset{|}{N}}-,$$

—S—, —O—, and —CH$_2$—, or is absent;
P and P$_1$ are selected from the group consisting of C$_1$ to C$_4$ alkyl, methoxy, ethoxy, butoxy, and H; and P$_1$ may be the same as P or different;

which method comprises providing a poly(vinyl alcohol/vinyl acetate) copolymer having a molecular weight of from about 5,000 to about 100,000 and from about 75% to about 90% hydrolysis by weight, and reacting said copolymer with a sufficient amount of an aromatic aldehyde salt in the presence of an acid to produce an aromatic ketal acid condensate of the reactants; then treating said ketal condensate with a sufficient amount of a base to produce a ketal condensate salt; and then reacting said ketal condensate salt with a sufficient amount of light-sensitive diazonium salt monomer to effect an ion exchange between said salts whereby a diazonium compound radical is substituted onto the aromatic ring of said ketal condensate.

11. The method of claim 10 wherein said acid is selected from the group consisting of H$_2$SO$_4$, H$_3$PO$_4$, HCl, HBr, HPF$_6$, H$_3$PO$_3$, and HBF$_4$.

12. The method of claim 10 wherein said base is an alkali metal hydroxide.

13. The method of claim 10 wherein said aldehyde is selected from the group consisting of aromatic aldehyde sulfonate salts.

14. The method of claim 10 wherein said diazonium salt monomer has the formula

[structural formula: R—K—(phenyl with P$_1$ and P substituents)—N$_2^+$Y$^-$]

wherein
R is selected from the group consisting of phenyl and C$_1$ to C$_4$ alkyl substituted phenyl.
—K— is selected from the group consisting of $$-\overset{H}{\underset{|}{N}}-,$$

—S—, —O—, and —CH$_2$—, or is absent;
P and P$_1$ are selected from the group consisting of C$_1$ to C$_4$ alkyl, methoxy, ethoxy, butoxy, and H;
P$_1$ may be the same as P or different; and
y$^-$ is an anion.

15. The method of claim 14 wherein the anion is selected from the group consisting of SO$_4^-$, SO$_3^-$, PO$_4^-$, Cl$^-$, F$^-$ and NO$_3^-$.

16. A method for producing a negative lithographic image which comprises providing a polymeric compound layer on a substrate, imagewise exposing said compound to actinic radiation, and then removing the non-exposed portions of the layer with a developer, wherein the polymeric compound has the formula

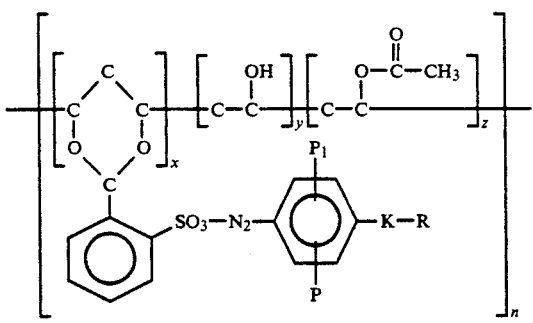

wherein
- x ranges from about 0.05 to about 0.5
- y ranges from about 0.80 to about 0.35
- z ranges from about 0.10 to about 0.25
- n ranges from about 50 to about 1500
- R is selected from the group consisting of phenyl and $C_1$ to $C_4$ alkyl substituted phenyl;
- K is selected from the group consisting of

—S—, —O—, and —$CH_2$—, or is absent;

P and $P_1$ are selected from the group consisting of $C_1$ to $C_4$ alkyl, methoxy, ethoxy, butoxy, and H; and $P_1$ may be the same as P or different.

17. The method of claim 16 wherein the developer is an organic solvent free aqueous composition which comprises one or more components selected from the group consisting of
   (a) a sodium, potassium or lithium salt of octyl, decyl or dodecyl monosulfate;
   (b) a sodium, lithium, potassium or ammonium metasilicate salt; and
   c) a lithium, potassium, sodium or ammonium borate salt; and
   d) an aliphatic dicarboxylic acid, or sodium, potassium or ammonium salt thereof having from 2 to 6 carton atoms; and
   e) mono-, di-, or tri-sodium or -potassium phosphate; and
   f) benzoic acid or sodium, lithium and potassium benzoates and the hydroxy substituted analogs thereof; and
   g) water.

18. The method of claim 16 further comprising the subsequent step of treating the coated substrate with a sufficient amount of a compound effect to prevent loss of hydrophilicity of the substrate and thereafter heating the substrate.

19. The method of claim 18 wherein the heating step is conducted by baking at a temperature of from about 180° C. up to the annealing temperature of the substrate.

20. The method of claim 19 wherein the baking is conducted for from about 2 to about 15 minutes.

* * * * *